United States Patent
Babich et al.

(10) Patent No.: US 6,428,894 B1
(45) Date of Patent: *Aug. 6, 2002

(54) TUNABLE AND REMOVABLE PLASMA DEPOSITED ANTIREFLECTIVE COATINGS

(75) Inventors: Katherina E. Babich, Chappaqua; Alessandro Cesare Callegari, Yorktown Heights, both of NY (US); Julien Fontaine, Orleans (FR); Alfred Grill, White Plains, NY (US); Christopher V. Jahnes, Monsey, NY (US); Vishnubhai Vitthalbhai Patel, Yorktown Heights, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 95 days.

(21) Appl. No.: 08/868,772

(22) Filed: Jun. 4, 1997

(51) Int. Cl.[7] .................................................. B32B 9/00
(52) U.S. Cl. ....................... 428/408; 428/212; 428/216; 428/336; 428/446
(58) Field of Search ............................... 428/408, 216, 428/336, 446, 212

(56) References Cited

U.S. PATENT DOCUMENTS

| | | | | |
|---|---|---|---|---|
| 4,698,256 A | * | 10/1987 | Giglia et al. | 428/408 |
| 4,898,798 A | * | 2/1990 | Sugata et al. | 430/58 |
| 5,080,455 A | * | 1/1992 | King et al. | 359/350 |
| 5,159,508 A | * | 10/1992 | Grill et al. | 360/113 |
| 5,225,296 A | * | 7/1993 | Cuomo et al. | 359/350 |
| 5,266,409 A | * | 11/1993 | Schmidt et al. | 428/336 |
| 5,294,518 A | * | 3/1994 | Brady et al. | 430/290 |
| 5,437,961 A | * | 8/1995 | Yano et al. | 430/316 |
| 5,462,784 A | * | 10/1995 | Grill et al. | 428/336 |
| 5,470,661 A | * | 11/1995 | Bailey et al. | 428/408 |
| 5,559,367 A | * | 9/1996 | Cohen et al. | 257/77 |
| 5,656,128 A | * | 8/1997 | Hashimoto et al. | 216/47 |
| 5,688,608 A | * | 11/1997 | Tsai et al. | 428/432 |
| 5,750,316 A | * | 5/1998 | Kawamura et al. | 430/311 |
| 5,830,332 A | * | 11/1998 | Babich et al. | 216/12 |
| 5,968,324 A | * | 10/1999 | Cheung et al. | 204/192.28 |

\* cited by examiner

Primary Examiner—Archene Turner
(74) Attorney, Agent, or Firm—Thomas A. Beck; Daniel P. Morris

(57) ABSTRACT

Disclosed is vapor deposited BARC and method of preparing tunable and removable antireflective coatings based on amorphous carbon films. These films can be hydrogenated, fluorinated, nitrogenated carbon films. Such films have an index of refraction and an extinction coefficient tunable from about 1.4 to about 2.1 and from about 0.1 to about 0.6, respectively, at UV and DUV wavelengths, in particular 365, 248 and 193 nm. Moreover, the films produced by the present invention can be deposited over device topography with high conformality, and they are etchable by oxygen and/or a fluoride ion etch process. Because of their unique properties, these films can be used to form a tunable and removable antireflective coating at UV and DUV wavelengths to produce near zero reflectance at the resist/BARC coating interface. This BARC greatly improves performance of semiconductor chips.

27 Claims, 8 Drawing Sheets

ETCH GROOVE IN SiO2

DEPOSIT ARC AND SPIN AND EXPOSE DEVELOP PHOTORESIST (PR)

RIE arc AND SiO2

STRIP PR AND arc BY PLASMO ETCHING

DEPOSIT SECOND METAL

CMP SECOND METAL

EXPERIMENTAL PARAMETERS

| SAMPLE | ID | BIAS (V) | PRESSURE (mTorr) | T °C | Ar/C₂H₂ (2%) (SCCM) | He/C₂H₂ (2%) (SCCM) | C₆H₁₂ (SCCM) | C₆F₆ (SCCM) | H₂ (SCCM) | N₂ (SCCM) | n @248nm | k @248nm |
|---|---|---|---|---|---|---|---|---|---|---|---|---|
| 1 | VP29-48 | -500 | 75 | 180 | | | | 4 | 10 | | 1.42 | 0.54 |
| 2 | VP29-55 | -600 | 100 | 180 | | | | 4 | 10 | | 1.52 | 0.48 |
| 3 | VP29-76 | -500 | 100 | 180 | | | | 4 | 16 | | 1.42 | 0.58 |
| 4 | VP29-79 | -500 | 75 | 180 | | | | 4 | 16 | | 1.58 | 0.48 |
| 5 | VP29-58 | -600 | 75 | 180 | | | | 4 | 16 | | 1.59 | 0.57 |
| 6 | kftmyyz | -214 | 100 | 60 | | | | 15 | | | 1.52 | 0.14 |
| 7 | CJI-27 | -225 | 100 | 180 | | | 5 | | | | 1.78 | 0.21 |
| 8 | CJI-25 | -300 | 100 | 180 | | | 5 | | | | 1.83 | 0.30 |
| 9 | EF-31 | -400 | 100 | 60 | | 50 | 5 | | | | 1.89 | 0.40 |
| 10 | 882 | -120 | 20 | 24 | 50 | | | | | | 2.01 | 0.41 |
| 11 | 469 | -120 | 20 | 260 | | | | | | | 2.14 | 0.53 |
| 12 | 500 | -122 | 20 | 24 | | 50 | | | | 1 | 1.98 | 0.45 |
| 13 | EFII | | | | | | | | | | 1.94 | 0.41 |

FIG.7

TUNABLE AND REMOVABLE PLASMA DEPOSITED ANTIREFLECTIVE COATINGS

FIELD OF THE INVENTION

The present invention is directed to methods of preparing tunable and removable antireflective coatings based on amorphous carbon films.

BACKGROUND OF THE INVENTION

As feature sizes shrink below 0.35 μm for logic and memory chips, critical dimension (CD) tolerances become more stringent. The variations in CD are directly related to substrate reflectance, which sharply increases at DUV (deep ultraviolet) wavelengths (365, 248, 193 nm). Substrate reflectance is notorious for producing standing wave effects and notching of the photoactive resist. Standing waves are thin film interference (TFI) or periodic variations of light intensity through the resist thickness. These light intensity variations are introduced because planarization of the resist presents differing thickness through the underlying topography. Notching results from substrate topography and non-uniform substrate reflectance which causes local variations in exposure energy on the resist. To effectively dampen this reflectance, "spin-on" ARC and dry deposited antireflective coatings (ARC) are used.

The antireflective coating formed at the substrate/resist interface is called bottom ARC (BARC). Spin-on BARCs are widely used in the manufacturing of computer chips, but they do present severe limitations. For example, they have poor optical tunability, which means that their index of refraction n and their extinction coefficient k can not be finely tuned to match resist and substrate optical properties. Furthermore, with feature dimensions shrinking below one quarter micron, these films cannot be conformally deposited over topography. A review of presently used spin-on BARC can be found in "Resist Enhancement with Antireflective Coatings", Semiconductor International, July 1996, pages 169–175, by Ruth deJule.

To overcome these problems, vapor deposited BARCs are being developed. These films are deposited preferably by plasma enhanced chemical vapor deposition. Thus, they can be conformally deposited over topography. Also their optical performance is far superior to that of spin-on BARCs. Applied Material Co. proposed a vapor deposition silicon oxynitride as a DUV BARC as reported in Solid State Technology, page 62, July 1996, in an article titled "Applied Developed ARC Using Silane-based CVD". These films do have good optical tunability, i.e. n and k can be varied by changing process conditions, but their removal after DUV exposure can be difficult. The fluorine chemistry used to remove the SiN film also etches the structures underneath.

F. D. Bailey et al. (U.S. Pat. No. 5,569,501), proposed to use an amorphous hydrogenated carbon film (a-C:H) deposited by vapor deposition from a hydrocarbon helium plasma as a BARC. These films were found to give lithographic performance superior to that of spin-on ARCs and they could be removed easily in an oxygen plasma without damaging the structures underneath. However, the index of refraction n could not be tuned over a wide range of values by changing process conditions.

It is an object of the invention to provide by vapor deposition an amorphous carbon film which has the required optical properties to form a DUV (365, 248, 193 nm) BARC. The method can be extended easily to manufacturing tools currently used in the semiconductor industry.

It is another object of the invention to carry out the depositions by vapor deposition in an argon/hydrocarbon/helium/hydrogen/fluorocarbon/nitrogen/oxygen mixture, preferably with the hydrocarbon being cyclohexane or acetylene and the fluorocarbon preferably being hexafluorobenzene. Higher indexes of refraction are obtained by limiting or excluding fluorocarbon (HFB) flow in the plasma chamber, while lower indexes of refraction are obtained by increasing the HFB flows and limiting or excluding the hydrocarbon gas flow. Finer optical tunability can be achieved by using proper flow amounts of nitrogen and/or oxygen. Hydrogen is used to tune optical properties as well as to improve film durability.

It is another object of the invention to provide a method of depositing a film structure by vapor deposition to be used as a BARC with optical properties optimized to minimize reflections at the resist/substrate interface. The process gas chemistry and the process parameters in general are uniquely optimized to achieve the preselected optical properties.

It is another object of the invention to provide a method of depositing a film structure by vapor deposition with optical properties that can be fine-tuned by continuously changing the refractive index n from bottom to top of the ARC layers to build a gradient effect. More importantly, if the n of the ARC layers is perfectly matched to the adjacent layers, there will be no reflection at the resist/ARC interface, greatly improving CD control.

SUMMARY OF THE INVENTION

A broad aspect of the present invention is the vapor deposition of an a-C:X:H film having tunable optical properties, where X is fluorine, nitrogen, oxygen, or silicon, or combinations thereof.

A more specific aspect of the method according to the present invention is the deposition of a hydrogenated carbon film by vapor deposition from a hydrocarbon/fluorocarbon/hydrogen plasma, optionally also maintaining a low amount of nitrogen and/or oxygen, such as about 1 standard ccm per deposition. The films produced herein can be tuned to match the substrate optical properties at 365, 248, 193 nm, making them extremely useful for bottom antireflective coatings. Additionally, unlike films being explored by others, the films formed in the present invention can be deposited conformally on topography and also can be readily removed in an oxygen and/or fluorine reactive ion etching process, thereby facilitating patterning for chip fabrication.

Another more specific aspect of the present invention is the process of depositing an amorphous carbon film by vapor deposition which comprises the steps of: admixing of hydrocarbon, fluorocarbon and hydrogen gases, optionally with a low amount of oxygen and/or nitrogen gases; providing a reactor chamber containing a cathode and the substrate; introducing the above gas mixture into the chamber; and applying an rf bias potential to the cathode to initiate a plasma and to deposit the a-C:X:H film on the substrate by vapor deposition.

More specifically, the present invention provides a method of depositing an amorphous carbon film by using a gas mixture which comprises hexafluorobenzene, hydrogen, cyclohexane and acetylene, which may or may not be diluted by helium and/or argon gases to reactively deposit a film by vapor deposition. By employing this method, the index of refraction n and the extinction coefficient k can be independently optically tuned at UV and DUV wavelengths. More specifically, the UV and DUV index of refraction n and extinction coefficient k can be tuned from about 1.40 to about 2.1 and about 0.1 to about 0.6, respectively, at 365, 248, and 193 nm. Therefore, these films meet all the requirements needed to be used as bottom antireflective coatings, since they now match the optical properties of both the substrate and the photoresist.

BRIEF DESCRIPTION OF THE DRAWINGS

FIG. 7 is "Table 1" as referred to hereinafter and sets forth a summary of deposition process parameters.

DETAILED DESCRIPTION

The present invention relates to a method of producing through vapor deposition from a hydrocarbon and/or a fluorinated hydrocarbon (fluorocarbon) plasma, a high quality hydrogenated/fluorinated carbon film useful as an optically tunable bottom antireflective coating. The film produced by the present invention has a highly tunable index of refraction and extinction coefficient which can be optionally graded along the film thickness to match the optical properties of substrate and photoresist. The optical properties at UV and DUV and the lithographic features of the film produced by the present invention are vastly superior to those obtained by other films such as the silicon oxy-nitride proposed by Applied Material Co. or found in the U.S. Pat. No. 5,569,501 by Bailey et al. Thus, Si substrates coated with the amorphous carbon film of this invention produce low reflectance at the resist/BARC interface at UV and DUV wavelengths, drastically reducing thin film interference and eliminating notching effects, which consequently improves CD control dramatically.

Figure 1:
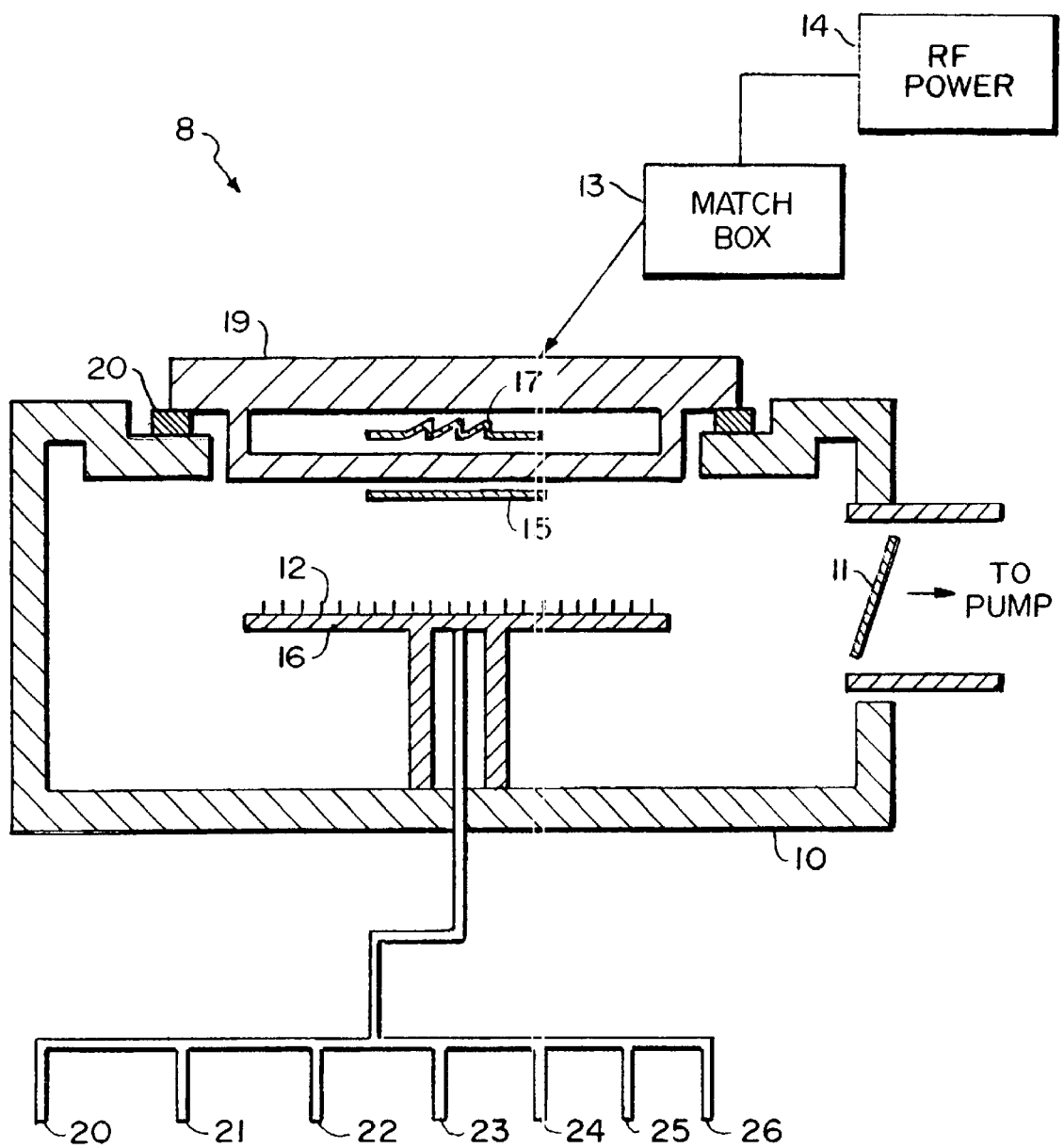
FIG. 1 is a schematic of a vapor deposition apparatus useful to practice the present invention.

FIG. 1 is a diagram of a plasma enhanced chemical vapor deposition apparatus 8 which can be used to deposit amorphous carbon films of the present invention. The apparatus includes a reactor chamber 10 having a throttle valve 11 which separates the reactor chamber 10 from a vacuum pump (not shown). A cathode 19 is mounted to the reactor chamber 10 and is isolated therefrom by a dielectric spacer 20. The cathode 19 is provided with a resistive heater 17. A substrate 15 is secured to the inner end of the cathode 19. As herein contemplated, the cathode 19 is electrically connected to a radio frequency source 14 which may be regulated, and the impedance between the cathode 19 and the radio frequency source 14 is matched by utilizing a match box 13. The electrical return ground is provided by plate 16 which is connected to the reactor chamber 10.

The reactor chamber 10 also contains conduits 20, 21, 22, 23, 24, 25 for introducing various gas materials into the chamber 10 through a shower head 12. For example, the hydrocarbon gases and the pre-mixed hydrocarbon gas mixtures are introduced into the reactor chamber 10 through conduits 25 and 26, respectively. The fluorinated carbon gas and the hydrogen gas are introduced into the chamber 10 through conduits 21 and 20, respectively. The reactive gases oxygen and nitrogen are introduced into the chamber 10 through conduits 23 and 22, respectively, while the argon gas for cleaning the substrate is introduced through conduit 24.

The hydrocarbon gas which can be used in the present invention may be any hydrocarbon compound which is first capable of being gaseous and then able to form a plasma at the reaction conditions employed in the present process. The term hydrocarbon implies that the molecules which make up the compound contain only carbon and hydrogen atoms. In accordance with one embodiment of the instant invention, saturated or unsaturated hydrocarbon compounds may be employed by the present process. By definition, a saturated hydrocarbon compound is a compound whose molecules contain only carbon single bonds while an unsaturated compound is a compound whose molecules contain at least one carbon double or triple bond.

In an especially preferred embodiment of the present invention, the preferred reactive hydrocarbon and fluorocarbon gases which are employed in forming the amorphous carbon film are cyclohexane and hexafluorobenzene (HFB), optionally diluted in an inert gas. Additionally, it should be recognized that mixtures of hydrocarbon gases such as cyclohexane/acetylene/methane may also be contemplated as the reactive hydrocarbon gas of the present invention.

Gases employed by the present invention have a purity greater than about 95.5%. In a preferred embodiment, the gases have a purity in the range from about 98.5 to about 99.99%. Most preferably, the gases have a purity greater than 99.99%.

The hydrocarbon, fluorocarbon, hydrogen, helium and argon gases are introduced into the chamber by first passing them through separate flow controllers at a sufficient flow to provide a total pressure of argon, hydrogen, hydrocarbon, fluorocarbon and helium from about 1 mTorr to 1000 mTorr. To provide the most effective amorphous carbon film it is preferred that the pressure of argon, hydrogen, hydrocarbon, helium mixture be about 1–500 mTorr. The above conditions can also be obtained by premixing the argon, hydrogen, fluorocarbon, hydrocarbon and helium in one, two or three gas cylinders in any possible combination to provide the desired gas concentration.

Preferably the argon, hydrogen, fluorocarbon and hydrocarbon gases are introduced into the chamber though separate flow controllers.

Suitable substrates which may be coated with the amorphous carbon film of the present invention include materials such as plastic; metals; various types of glass; magnetic heads; electronics chips; electronic circuit boards; semiconductor devices; and the like. The substrate to be coated may be any shape or size provided that the substrate may be placed into a reactor chamber apparatus. Thus, regularly or irregularly shaped objects of any dimension may be used in the present invention. Preferably, the substrate is a Si substrate used in the fabrication of semiconductor devices.

The substrate is mounted on the cathode holder inside the reactive sputtering chamber of the reactor device. The reactive chamber is then tightly sealed and evacuated until a pressure reading in the range of about $1\times10^{-3}$ to about $1\times10^{-3}$ Torr is obtained.

After evacuating the reaction chamber to the desired pressure in the range mentioned hereinabove, the substrate is then heated to a temperature from about 25 to about 400° C. Preferably, the substrate is held at a constant temperature within the range of about 50 to about 200° C. throughout the entire deposition process.

The substrate material used may or may not be subjected to rf sputter cleaning using the rf cathode in the chamber prior to depositing the amorphous carbon film. Suitable cleaning techniques employed by the present invention include rf plasma cleaning with hydrogen, argon, oxygen, nitrogen or mixtures thereof, performed singly or in a suitable sequential combination.

After achieving the desired pumpdown pressure, the admixed gases are introduced into the reaction chamber at a flow rates of about 1 to about 1000 sccm. More preferably the flow rate of the reactant gases is from about 1 to about 100 sccm and the flow rate of the hydrogen gas is from about 1 to about 100 sccm. Most preferably, the flow rate of the HFB gas is about 4 sccm and the flow rate of hydrogen gas is about 10 sccm. The gasses are introduced into the reaction chamber at a pressure of about 5 to about 200 mTorr. It is most preferred that the admixture be introduced at a pressure of about 75 Mtorr.

During deposition, an rf bias is applied to the substrate mounted on the cathode. The cathode DC self-bias ranges from about −10 to about −1000 Volt throughout the carbon deposition process. This self-bias voltage is acquired by applying the rf power to the cathode. Radio frequency impedance matching is obtained by using an rf matching box. Most preferably, the substrate rf bias voltage is maintained at about −600 V throughout the experiment. The power density applied to the substrate can range from about 0.005 to about 5 W/cm2. Most preferably, the power density employed by the present invention is maintained at about 1.07 W/cm$^2$ throughout the deposition process.

The amorphous carbon film is deposited onto the substrate at a rate such as that an essentially continuous coating of the film on the substrate is obtained. More specifically, by employing the previously mentioned operation parameters, the amorphous carbon film is deposited onto the substrate at a rate of about 20 to about 2000 A/min. Most preferably, the rate of depositing the amorphous carbon film onto the substrate is at a rate of about 215 A/min.

In accordance with the present invention, the amorphous carbon film thickness deposited on the substrate ranges from about 100 to about 8000 A. More preferably, the thickness of the amorphous carbon film coating ranges from about 100 to about 1200 A. It should be noted that by changing process parameters such as bias voltage, gas flow rates, and gas pressure, film optical constants can be changed. Herein, film optical constants are defined as the index of refraction n and the extinction coefficient k. Thus, it is quite possible to make a substrate with defined optical constants by merely increasing or decreasing the fluorine and/or the hydrogen/fluorine ratio of the film. The preferred optical constants of the amorphous carbon film for antireflective coating applications prepared by the present process are n in the range from about k=0.1 to about k=0.6 and about n=1.40 to about n=2.1 at wavelengths of 365, 248 and 193 nm.

The amorphous carbon films formed by the present invention can be used as an ideal bottom antireflective coating (ARC) for UV (365 nm) and DUV (248 and 193 nm) applications. The advantage of a carbon ARC compared to a silicon nitride ARC is that carbon can be removed very easily by an oxygen plasma without damaging the underlying layers, thereby enhancing linewidth control and performance of integrated circuits. On the contrary, removal of SiN ARC in a fluorine based chemistry tends to etch also the underlying features thus damaging device performances.

Figure 2A:
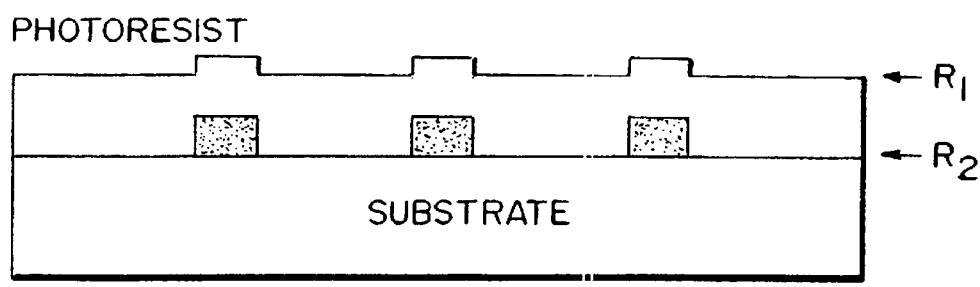
FIG. 2(a) shows photoresist on topography. Reflectance at the substrate and air interfaces are indicated; (b) shows photoresist with a top and bottom ARC on a substrate with topography.
Figure 2B:
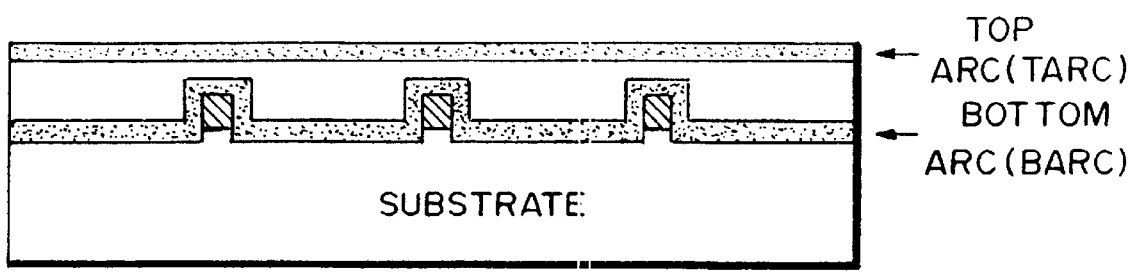

In the ARC technology, in order to improve critical dimension (CD) control and therefore increase linewidth control, the swing ratio or amplitude has to be minimized. The swing ratio is defined as:

$$S=4(R_1 R_2)^{0.5} e^{-\alpha d} \quad (1)$$

where $R_1$ is the reflectance at the resist/air interface, $R_2$ is the reflectance at the resist/substrate interface, a is the absorption coefficient, d is the resist thickness, k is the extinction coefficient and $\lambda$ is the light wavelength. In this invention, we are mainly concerned with the reduction of the swing ratio by minimizing $R_2$ using a bottom ARC. A diagram explaining the significance of the above parameters is shown in FIG. 2.

In general, the bottom ARC thickness has to be computed in such a way that reflectance at the resist/BARC is a minimum. To achieve this, a knowledge of the optical constants of the entire film structure is necessary in order to compute the ARC exact thickness for minimum reflectance.

In general, ARC thickness d varies between about 200 to about 1000 A, depending on the film structure used. The extinction coefficient k varies between about 0.3 to about 0.6. More commonly, the k values were between about 0.4 and about 0.5 at DUV. The index of refraction n varies between about 1.4 to about 2.1. More commonly, the n values were between about 1.52 and about 2.0 at DUV. Lower indexes of refraction are obtained by adding a small amount of fluorine and hydrogen to the plasma during the deposition process, such as by way of about 1 to about 10 sccms of a hydrogen and fluorine.

The following examples are given to illustrate the scope of the present invention. Because these examples are given for illustrative purposes only, the inventions embodied therein should not be limited thereto.

EXAMPLE 1

Figure 3A:
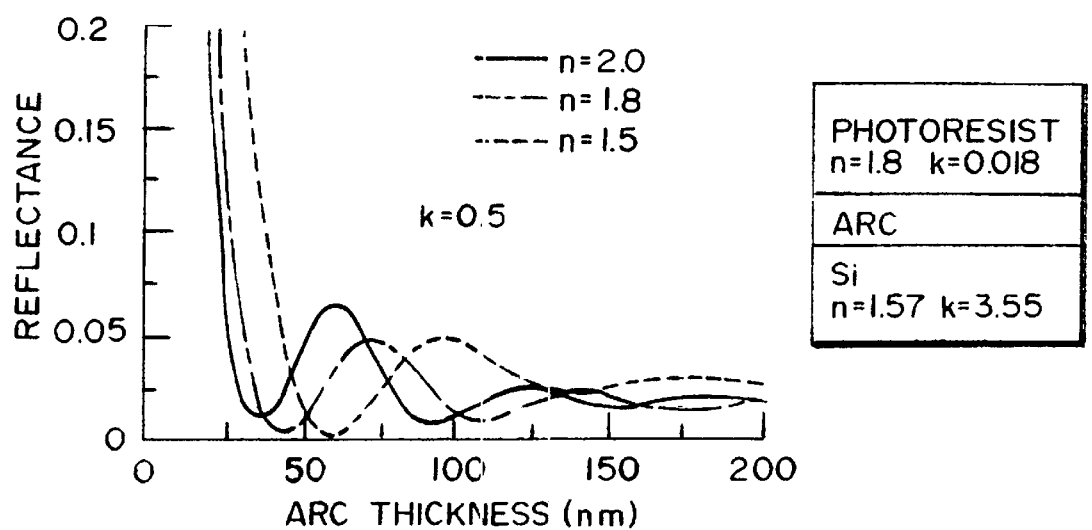
FIG. 3 shows simulated reflectance curves at the photoresist/ARC interface as a function of a single carbon ARC thickness for various optical constants n and k.
Figure 3B:
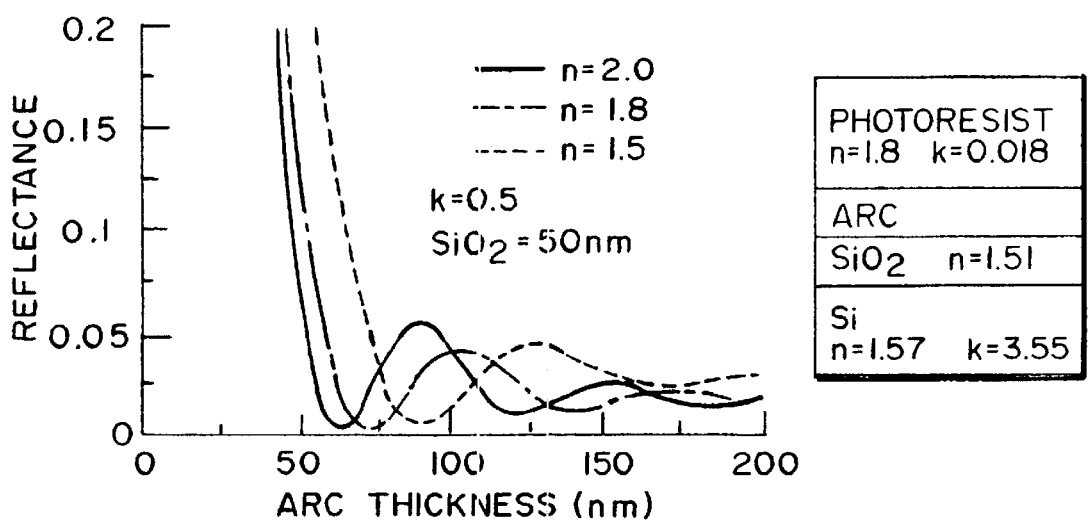

The following example illustrates calculations of the reflectance $R_2$ at the resist/BARC interface for two different thin film structures. The algorithm uses the Fresnel coefficients as found in standard textbooks such as in *Optics*, by E. Hecht and A. Zajac, published in 1979 by Wiley, pages 312 and 313. These simulations can be extended to many different structures and are not limited to the two examples below. The optical constants have to be specified for each layer of the structure. If the film is transparent or semitransparent at DUV then film thickness need to be specified so as to include film internal multiple reflectances. FIG. 3 shows the reflectance at the resist/ARC interface as a function of ARC thickness calculated at 248 nm for two different thin film structures. For the top structure, the ARC is deposited directly on Si. For the bottom structure the ARC is deposited on a thin $SiO_2$ film. The corresponding reflectances are shown on the left side. In these simulations the extinction coefficient k was kept constant and equal to 0.5. The index of refraction n varied from about 1.5 to about 2.0. For thin ARCs deposited directly on Si, minimum reflectances are obtained at thickness between about 30 and about 60 nm depending on the index of refraction (FIG. 3 top). For thin ARCs deposited on a thin $SiO_2$ film minimum reflectance occurs at a thickness between about 60 and about 90 nm, depending on the index of refraction (FIG. 3 bottom). FIG. 3 shows that minimum reflectance occurs at different ARC thicknesses, according to which thin film stack is used. Thus, simulations are necessary for optimizing ARC characteristics.

Photoresist and $SiO_2$ optical constants at 248 nm were chosen according to measurement techniques discussed in Example 3.

EXAMPLE 2

The following example is given to illustrate the process of depositing a hydrogenated and fluorinated amorphous carbon film (to be used as an ARC) onto a substrate, preferably Si, by vapor deposition in a hexafluorobenzene/hydrogen gas mixture with optical characteristics similar to the ones simulated in Example 1.

Experiments were carried out for depositing the amorphous carbon film on both five and eight inch diameter round Si substrates. The substrates, which were already precleaned, were blow dried with (filtered) nitrogen gas to remove residual particulate before being loaded on the cathode 19 of FIG. 1. Thereafter, the system was evacuated to a base pressure reading of about $1\times10^{-5}$ Torr or lower. The substrate was sputter cleaned for 1 min at a power density of 0.4 $W/cm^2$ at 100 mTorr Ar pressure to ensure good adhesion of the carbon film to the Si substrates. The amorphous carbon films were deposited from a mixture of hexafluorobenzene/hydrogen gas, in a flow ratio of 4:10, respectively. The cathode power density was 1.07 $W/cm^2$, resulting in a −600 Volt negative self-bias, and the pressure was 100 mTorr. During the entire deposition process, the substrates were held at 180° C. When a non-fluorinated film was to be deposited, the hexafluorobenzene/hydrogen gas was replaced by cyclohexane, in this case at a flow rate of 10 sccm and at a pressure of 100 mTorr. A summary of the process parameters used is shown in Table 1. The gases employed in the present processes had a purity of greater than about 99.99%. The amorphous carbon film was deposited onto the substrates at a rate of about 215 A/min.

EXAMPLE 3

The following example illustrates how to measure the optical constants n and k of the amorphous carbon film deposited by vapor deposition in a cyclohexane/hexafluorobenzene gas mixture. This measurement technique can be applied to a variety of different processes and it is not limited by the examples described.

The optical constants were measured using an n&k Analyzer manufactured by n&k Technology, Santa Clara, Calif. A description of this instrument and its operation can be found in U.S. Pat. No. 4,905,170, 1990. The Analyzer uses a method based on broadband spectrophotometry and equations for optical constants derived by Forouhi and Bloomer (Phys. Rev. B, 38, pp. 1865–1874, 1988). Their analysis is based on a physical model for the refractive index n and extinction coefficient k which is applicable to a wide range of semiconductor and dielectric films, and is valid over the deep ultraviolet through near infrared wavelength range.

Both n and k are functions of the wavelength of light, $\lambda$, i.e., $n=n(\lambda)$ and $k=k(\lambda)$. For pure crystalline materials, the values of $n(\lambda)$ and $k(\lambda)$ are distinct and characteristic of the chemical elements comprising the crystal. On the other hand, for thin films of materials, the values of $n(\lambda)$ and $k(\lambda)$ will depend on processing conditions. If processing conditions for thin film deposition vary, microstructure and composition of the films can vary. Any changes in microstructure or composition will generate changes in the values of the $n(\lambda)$ and $k(\lambda)$ spectra of the film.

The $n(\lambda)$ and $k(\lambda)$ spectra of any material cannot be measured directly, but are determined from a de-convolution of a reflectance measurement's $R(\lambda)$. This measurable quantity depends on film thickness, optical constants of the films and nature of the substrate. The "n&k Method" provides an accurate, rapid, and non-destructive way to uncouple a reflectance measurement. Algorithms can be generated that compare the theoretical reflectance with the measured one. From this comparison film thickness, $n(\lambda)$ and $k(\lambda)$ spectra can be determined.

Table 1 shows the n and k values of vapor deposition carbon deposited film measured by the n&k analyzer and described in Example 2. For the processes used in this example, n can be tuned from about 1.42 to about 2.14, and k from about 0.14 to about 0.58. Low index of refraction is obtained when fluorine is added to the plasma. When fluorine is excluded, a higher index is obtained.

EXAMPLE 4

Figure 4:
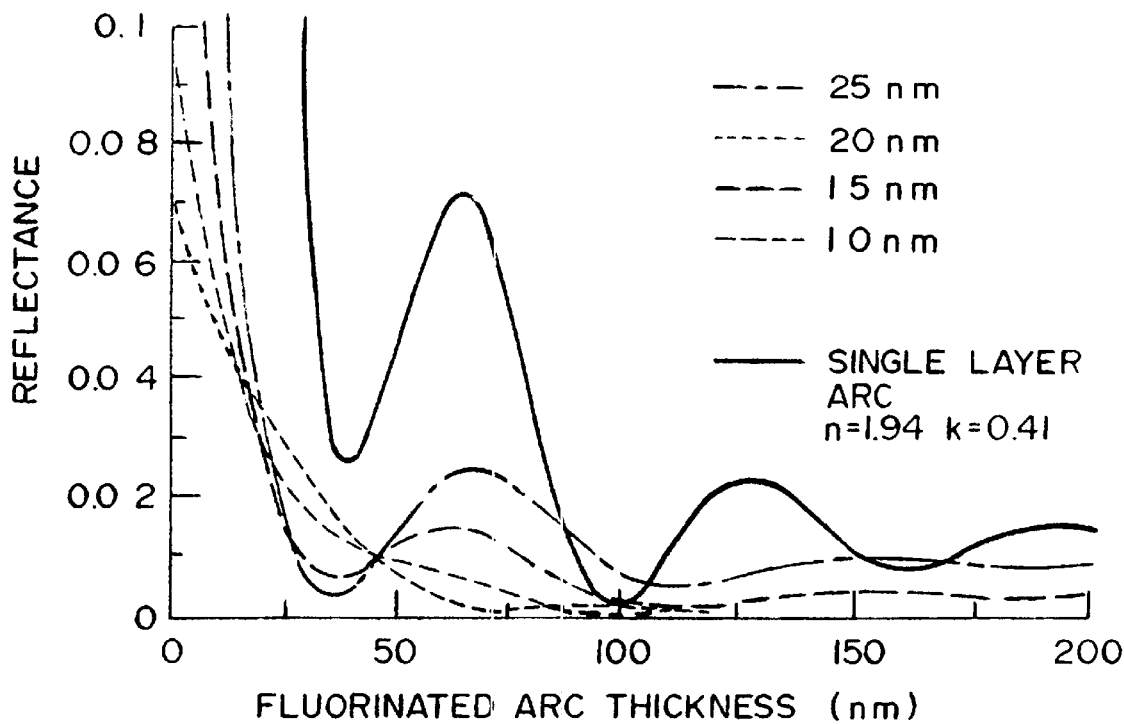
FIG. 4 shows simulated reflectance curves at the photoresist/ARC interface as function of fluorinated carbon ARC thickness for a tunable trilayer ARC having a top layer of varying thickness.

This example illustrates how a tunable carbon ARC can be fabricated using a layered film structure. A tunable ARC has an index of refraction which matches the substrate (Si or $SiO_2$) at the bottom and an index of refraction which matches the photoresist on top. In practice, a thin ARC adhesion layer has to be deposited first because a fluorinated plasma which produces a low n film can damage the underlying Si or $SiO_2$ (FIG. 4). The optical constants and layer thickness of this tunable ARC layer have to be chosen in such a way to minimize reflectance at the ARC/resist interface. In order to achieve this, simulations at 248 nm (DUV) as described in Example 1 have to be performed. These simulations use a trilayer structure with an adhesion layer 15 nm thick with n=1.83 and k=0.3, followed by a low index layer with n=1.52 and k=0.48 and a top layer with the same optical constants as the adhesion layer. The indexes 1.52 and 1.83 closely match the substrate and the photoresist indexes, respectively. Reflectance curves do not change appreciably if the adhesion layer is thin. Film structure and simulations are shown in FIG. 4. Reflectance at the ARC/resist interface is computed as a function of the fluorinated ARC thickness for different top ARC layer thicknesses. The solid line represents the reflectance for a single non-fluorinated ARC as shown in Table I, process 13. FIG. 4 shows that by using a tunable ARC reflectance, variations are significantly reduced by a factor of 4, on average, when compared to a single ARC layer.

The optical constants of the tunable ARC were obtained from processes practiced in this invention. The adhesion and the top ARC layers correspond to process 8 of Table I. The fluorinated ARC layer corresponds to process 2 of Table I. The index of refraction can also be smoothly graded (from about 1.83 to about 1.52) by smoothly changing gas flow conditions during deposition. Building a gradient minimizes internal reflectance at the interfaces of the fluorinated ARC layer with the top ARC layer and the adhesion ARC layer.

EXAMPLE 5

This example illustrates how reflectance swing curves can be generated for thin film structures formed on a Si substrate. The swing curve is a measure of the periodic variation of reflectance as a function of photoresist thickness. Critical dimension (CD) control is directly proportional to the amplitude variation of the swing curve. Thus, to achieve better device performance it is necessary to reduce the amplitude of the swing curve.

In this example varying photoresist thicknesses were spun on Si substrates over an ARC film as described in Table I, process 10. The ARC film was 85 nm thick. The photoresist was a DUV resist (UV4), obtained from Shipley, which is used in the manufacturing of computer chips. Other DUV resist with similar optical properties can be used in this experiment and this example should not limited to the use of a UV4 resist only. After the resist was spun on the substrates, it was baked for 110 sec at 90° C.

Figure 5:
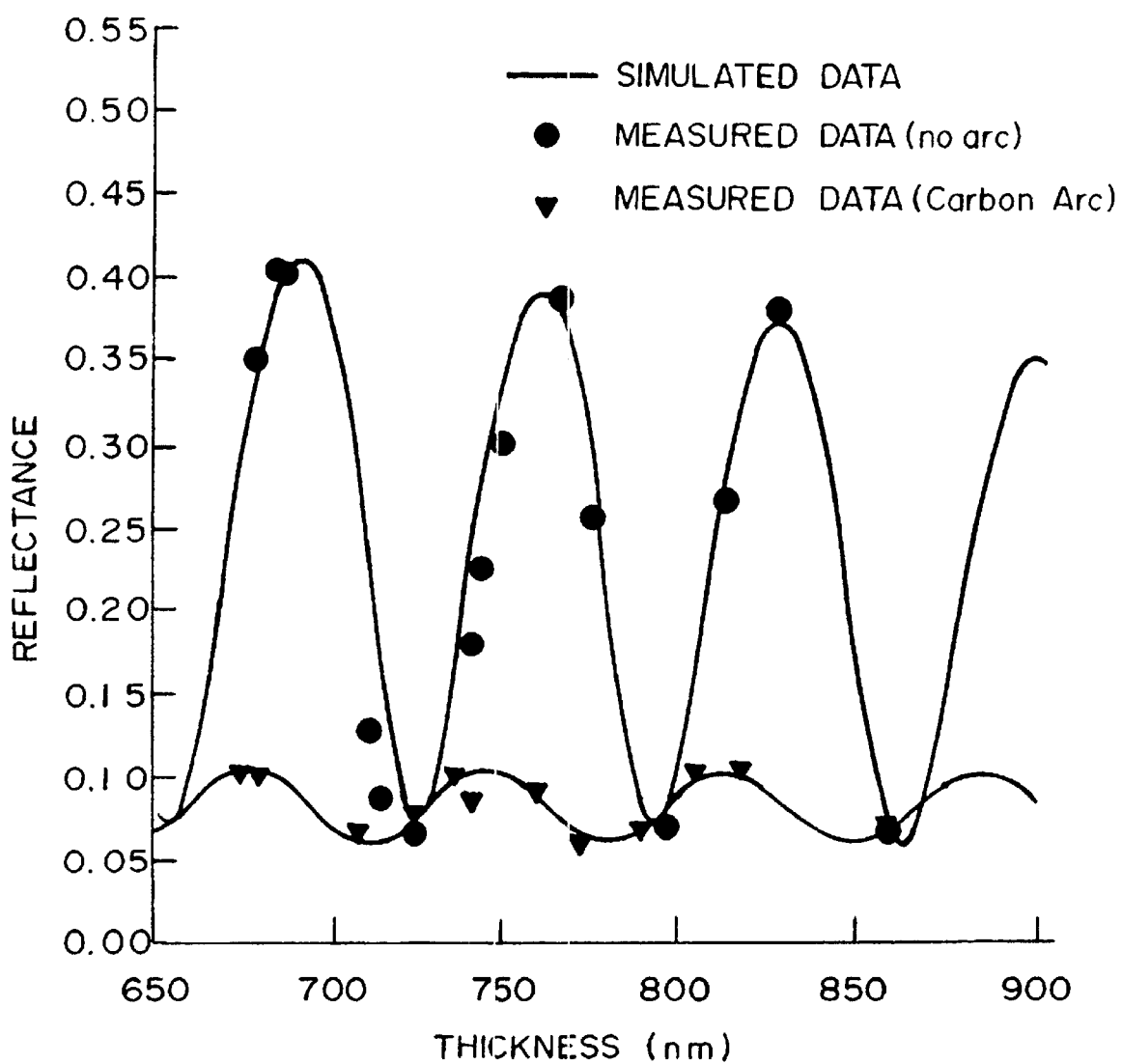
FIG. 5 shows reflectance vs photoresist thickness (swing curve) for a single layer carbon ARC deposited according to process 10 of Table I (see description of FIG. 7).
Figure 6A:
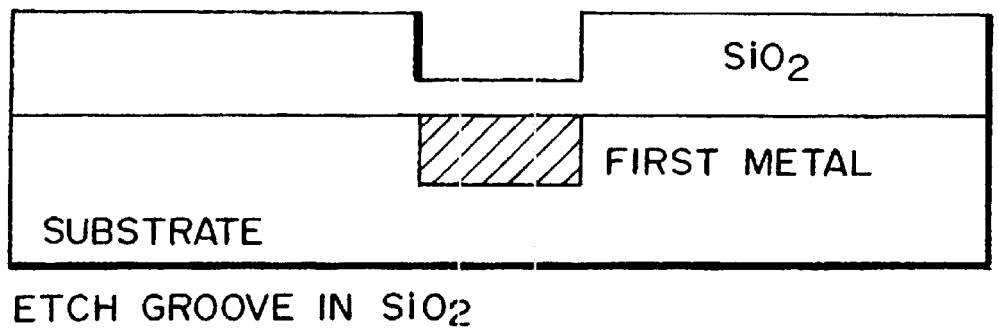
FIG. 6 shows the use of a carbon ARC in the dual damascene process.
Figure 6B:
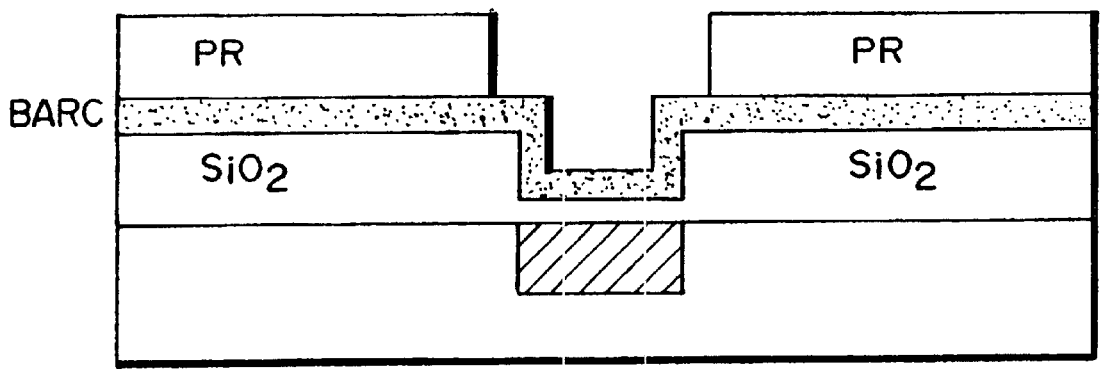
Figure 6C:
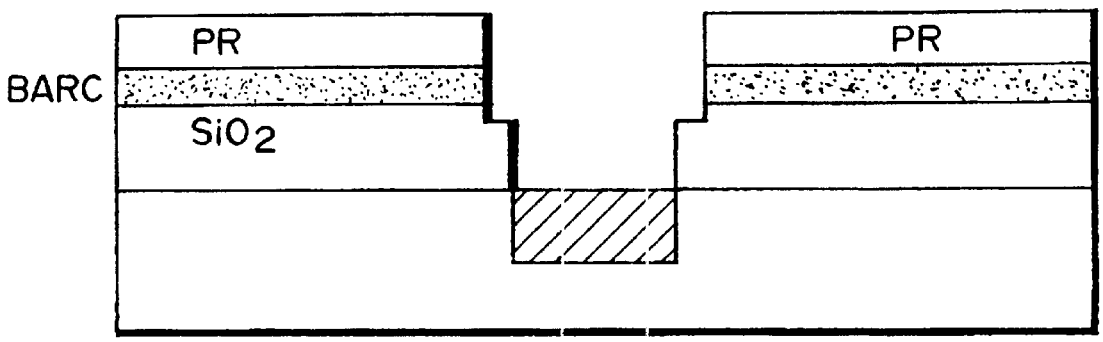
Figure 6D:
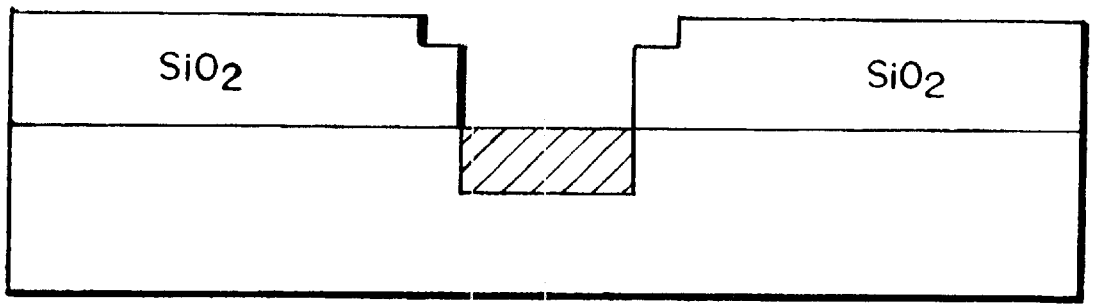
Figure 6E:
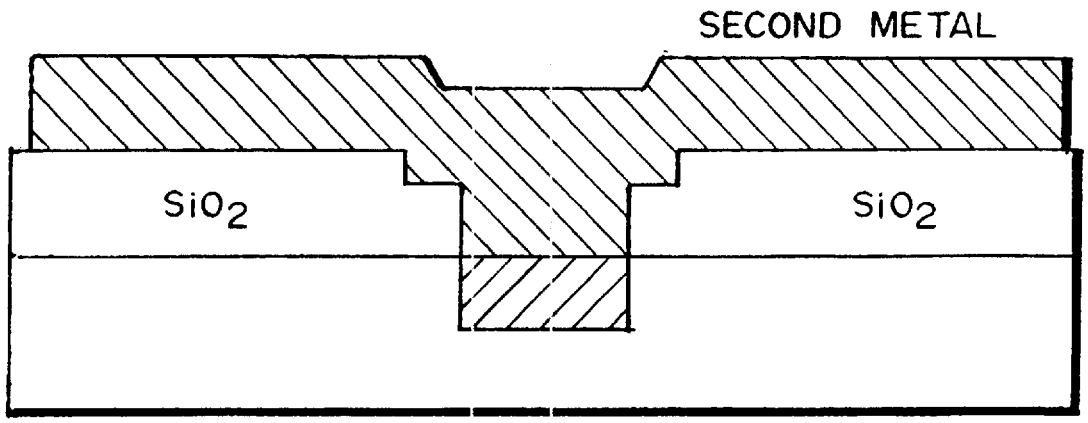
Figure 6F:
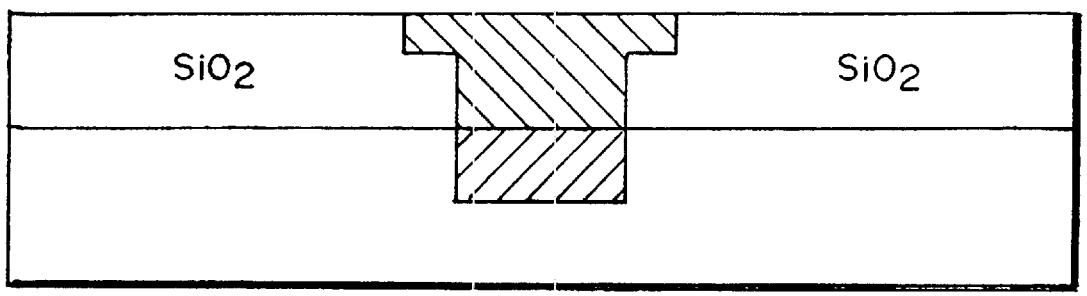

Reflectance at 248 nm for the different photoresist thicknesses was measured using the n&k Aanalyzer. UV4 resist process and reflectance measurements were also done, for comparison purposes, on substrates which contained no BARC . FIG. 5 shows the result. By using a BARC , the swing ratio was reduced by about 4 times when compared to a Si substrate with no ARC.

EXAMPLE 6

This example illustrates how the carbon ARC can be used in the dual damascene process as device features shrink below 0.35 mm. Spin-on ARCs can not be used because they are not conformal over submicron topography. In the dual damascene process the metal lines are deposited together with the vias and then planarized, for example, by chemomechanical polishing.

FIG. 6 shows a diagram of the process flow for the dual damascene process. First an insulator such as $SiO_2$ is deposited onto a substrate containing a planarized metal line, and a groove is etched on the insulator by reactive ion etching (RIE) as shown in FIG. 6(a). A carbon ARC as described in the previous examples is deposited on top of the insulator and the photoresist is spun on top, exposed to DUV through a photomask and developed (b). The BARC is reactive ion etched in an oxygen or fluorine plasma. Then the $SIO_2$ is removed in a fluorine plasma until the first metal line remains exposed (c). The photoresist and the BARC are stripped in an oxygen plasma (d). Finally a second metal is deposited over the substrate and planarized by chemomechanical polishing (e and f).

Note that the process can be simplified greatly if a low index (n~1.5, Table I) fluorinated film is used as insulator instead of an $SiO_2$ layer. In this case the fluorinated carbon film acts as a BARC, and the steps of FIG. 6 which include deposition, RIE, and ARC removal are eliminated.

While the invention has been particularly shown and described with respect to best and various embodiments thereof, it will be understood by those skilled in the art that the foregoing and other changes in form and detail may be made therein without departing from the spirit and scope of the invention.

Having thus described our invention, what we claim as new and desire to secure by Letters Patent is:

1. A multilayer resist system structure comprising:
    at least one substrate, having on at least one major surface thereof, at least one finely optically tunable vapor deposited antireflective coating material (BARC), said BARC being a film overcoated with a layer of energy photoactive material;
    said substrate is selected from the group consisting of a semiconductor, a polymer, glass, a metal and any combinations thereof and a magnetic head, electronic chip circuit board and semiconductor device;
    said layer of photoactive material comprises a photoresist in dry sheet form and said photoactive material is selected from the group consisting of compositions which are sensitive in the UV wavelength range, compositions which are sensitive in the DUV wavelength range, compositions which are sensitive in the UV and DUV ranges, and combinations thereof;
    said BARC is selected from the group consisting of diamond-like carbon, fluorinated diamond-like carbon, fluorinated hydrogenated diamond-like carbon, nitrogenated diamond-like carbon, amorphous fluorinated hydrogenated carbon, amorphous fluorinated carbon, fluorinated tetrahedral carbon, amorphous nitrogenated carbon, amorphous nitrogenated hydrogenated carbon, nitrogenated hydrogenated carbon, nitrogenated tetrahedral carbon, and combinations thereof;
    said BARC film having optical constants wherein the index of refraction n has values range from about 2.1 to about 1.4 and extinction coefficient k has values in the range from about 0.1 to about 0.6;
    said antireflection coating disposed between said substrate and said photoactive material has said index of refraction and said extinction coefficient tuned to substantially match those of said photoactive material and said substrate at the interface with each.

2. The structure of claim 1, wherein the swing ratio reduction of the BARC is at least about 4.

3. The structure of claim 1, wherein there is about 0 reflectance at the interface of the photoactive material and the BARC.

4. The structure of claim 1, wherein the substrate is a semiconductor comprised of silicon.

5. The BARC of claim 1, wherein the BARC is uniform in thickness and optically nonuniform, with a gradient index of refraction.

6. The BARC of claim 1, wherein the index of refraction is tunable between about 1.4 to about 2.1 at 365, 248 and 193 nms.

7. The BARC of claim 1, wherein the extinction coefficient is tunable from about 0.1 to about 0.6 at 365, 248 and 193.

8. The BARC of claim 1, wherein the index of refraction is tuned to about 1.5 at its first major surface to match that of the major surface of the substrate with which the first major surface is in contact, and tuned to about 1.8 at its second major surface to match that of the photoresist with which the second major surface is in contact.

9. The BARC of claim 1, wherein the vapor deposited material includes a dopant selected from the group consisting of oxygen, silicon and mixtures thereof.

10. The BARC of claim 1, wherein the vapor deposited material is patternable and removable by reactive ion etching in a gas selected from the group consisting of oxygen, fluorine, and combinations of oxygen and fluorine.

11. The BARC of claim 1, comprising a single layer film of uniform thickness, said film having an index of refraction of about 1.42 to about 2.1 and an extinction coefficient of about 0.3 to about 0.6 at wavelengths of 365, 248 and 193 nms.

12. The BARC of claim 1, having an index of refraction of about 1.9 and an extinction coefficient of about 0.4 at 248 nm.

13. The BARC of claim 1, having an index of refraction of about 1.8 and an extinction coefficient of about 0.3 at 248 nm.

14. The BARC of claim 1, wherein the extinction coefficient is about 0.2 to about 0.6.

15. The BARC of claim 1, having a uniform thickness of about 100 to about 2000 Angstroms on a substrate.

16. The BARC of claim 1, having a uniform thickness of about 400 A on a substrate.

17. The BARC of claim 1, having a uniform thickness of about 900 A on a substrate.

18. The BARC of claim 1, wherein the extinction coefficient is about 0.4 to about 0.5.

19. A bilayer structure having two layers of BARC and having a first layer of BARC, said first layer having a bottom surface and a top surface, having an index of refration of about 1.5, an extinction coefficient of about 0.5, and a thickness of about 100 to 1000 Å which first layer of BARC is deposited on a first major surface of a substrate so that the bottom surface of said first layer of BARC is in contact with said first major surface of said substrate, said BARC selected from the group consisting of fluorinated diamond-like carbon, fluorinated hydrogenated diamond-like carbon, nitrogenated diamond-like carbon, amorphous fluorinated hydrogenated carbon, amorphous fluorinated carbon, fluorinated tetrahedral carbon, amorphous nitrogenated carbon, amorphous nitrogenated hydrogenated carbon, nitrogenated hydrogenated carbon, nitrogenated tetrahedral carbon, and combinations thereof.

20. The bilayer structure of claim 19, wherein the two layers of BARC comprise materials selected from the group consisting of DLC, FDLC, FHDLC, NDLC, amorphous fluorinated hydrogenated carbon, amorphous fluorinated carbon, fluorinated tetrahedral carbon, amorphous nitrogenated carbon, amorphous nitrogenated hydrogenated carbon, nitrogenated tetrahedral carbon, and any combination thereof.

21. The bilayer structure of claim 20, wherein the BARC material includes dopants selected from the group consisting of oxygen, silicon or mixtures thereof.

22. The bilayer structure of claim 19 having a second layer of BARC, said second layer of BARC having a bottom surface and a top surface, and having an index of refraction of about 1.8, an extinction coefficient of about 0.3 and a thickness from about 200 to about 1000 Å, and wherein said bottom surface of said second layer is deposited on said top surface of said first layer and overlaid with a photoactive material which is removable by reactive ion etching.

23. A multilayer structure wherein the indexes of refraction within at least one first layer of BARC are smoothly graded between a lower value to a higher value through the thickness of said first BARC layer, wherein said first BARC layer has a bottom surface and a top surface and is selected from the group consisting of fluorinated diamond-like carbon, fluorinated hydrogenated diamond-like carbon, nitrogenated diamond-like carbon, amorphous fluorinated hydrogenated carbon, amorphous fluorinated carbon, fluorinated tetrahedral carbon, amorphous nitrogenated carbon, amorphous nitrogenated hydrogenated carbon, nitrogenated hydrogenated carbon, nitrogenated tetrahedral carbon, and combinations thereof.

24. The multilayer structure of claim 23, including the at least one layer of BARC in which the index of refraction is smoothly graded from about 1.8 to about 2.0 through a uniform layer thickness of about 20 to about 300 Angstroms.

25. The multilayer structure of claim 24, including at least one additional layer of BARC said additional layer of BARC having a bottom surface and a top surface, and having an index of refraction of about 1.5, and extinction coefficient of about 0.5, and a thickness of about 100 to about 1000 Å, said bottom surface of said additional BARC layer is positioned on said top surface of said first layer of BARC.

26. The multilayer structure of claim 24, including at least one additional layer of BARC said additional layer of BARC having a bottom surface and a top surface, and having an index of refraction of about 1.8, and extinction coefficient of about 0.3, and a thickness of about 100 to about 1000 Å, said bottom surface of said additional BARC layer is positioned on said top surface of said first layer of BARC.

27. The multilayer structure of claim 23, including the at least one layer of BARC wherein the index of refraction is smoothly graded from about 1.5 to about 1.8.

* * * * *